(12) United States Patent
Khayat et al.

(10) Patent No.: US 11,462,616 B2
(45) Date of Patent: Oct. 4, 2022

(54) DRIVER FOR TRANSISTOR

(71) Applicant: TEXAS INSTRUMENTS INCORPORATED, Dallas, TX (US)

(72) Inventors: Joseph Maurice Khayat, Bedford, NH (US); Marco Corsi, Oak Point, TX (US); Lemuel Herbert Thompson, Melissa, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 367 days.

(21) Appl. No.: 15/602,908

(22) Filed: May 23, 2017

(65) Prior Publication Data

US 2018/0219533 A1 Aug. 2, 2018

Related U.S. Application Data

(60) Provisional application No. 62/465,672, filed on Mar. 1, 2017, provisional application No. 62/452,116, filed on Jan. 30, 2017.

(51) Int. Cl.
| | |
|---|---|
| *H01L 29/10* | (2006.01) |
| *H03K 19/0185* | (2006.01) |
| *H01L 29/40* | (2006.01) |
| *H01L 29/78* | (2006.01) |
| *H03K 17/06* | (2006.01) |
| *H01L 29/06* | (2006.01) |
| *H01L 29/423* | (2006.01) |

(52) U.S. Cl.
CPC ........ *H01L 29/1045* (2013.01); *H01L 29/402* (2013.01); *H01L 29/7816* (2013.01); *H03K 17/063* (2013.01); *H03K 19/018507* (2013.01); *H01L 29/0653* (2013.01); *H01L 29/42368* (2013.01)

(58) Field of Classification Search
CPC .. H01L 29/1045; H01L 29/402; H03K 17/063
USPC ........................................................ 327/109
See application file for complete search history.

(56) References Cited

U.S. PATENT DOCUMENTS

| | | | | |
|---|---|---|---|---|
| 2013/0020632 | A1* | 1/2013 | Disney | H01L 29/66659 257/328 |
| 2013/0292763 | A1* | 11/2013 | Chang | H01L 29/7835 257/335 |
| 2016/0118894 | A1* | 4/2016 | Zhang | H02M 3/158 323/271 |

OTHER PUBLICATIONS

A. Ferrara etal., "The Boost Transistor: a Field Plate Controlled LDMOST", IEEE Proceedings of the 27th International Symposium on Power Semiconductor Devices & IC's, May 10-14, 2015, Kowloon Shangri-La, Hong Kong.*

* cited by examiner

*Primary Examiner* — Metasebia T Retebo
(74) *Attorney, Agent, or Firm* — Ray A. King; Charles A. Brill; Frank D. Cimino (57) ABSTRACT

In the described examples, a driver includes a signal controller that provides a gate control signal to a gate buffer coupled to a gate of a transistor and a field plate control signal to a field plate buffer coupled to a field plate of the transistor. The signal controller provides a rising edge on the field plate control signal causing the field plate buffer to provide a bias voltage on the field plate of the transistor a predetermined amount of time after providing a rising edge on the gate control signal that causes the gate buffer to provide a turn-on voltage on the gate of the transistor that causes the transistor to transition from a cutoff region to a saturation region and to a linear region.

13 Claims, 4 Drawing Sheets

DRIVER FOR TRANSISTOR

RELATED APPLICATIONS

This application claims priority to U.S. Provisional Application No. 62/452,116 filed on 30 Jan. 30 2017 and to U.S. Provisional Application No. 62/465,672 filed on 1 Mar. 2017, the entirety of each is incorporated herein by reference.

TECHNICAL FIELD

This disclosure relates generally to electronic circuitry, and more particularly to a driver for a transistor.

BACKGROUND

Power MOSFETs (metal oxide semiconductor (MOS) field-effect transistors (FET)) are used as electric switches for high frequency pulse width modulation (PWM) applications such as voltage regulators and/or as load switches in power applications. When power MOSFETs are employed as load switches, on-state resistance of the switches may be one of the prevailing design considerations in order to reduce conduction power losses and improve system efficiency.

Laterally diffused metal oxide semiconductor (LDMOS) devices, such as transistors use epitaxial layers to achieve high breakdown voltage (>20V) needed for many applications. LDMOS transistors built on P-type epitaxial substrates are N-Type LDMOS. A drain of this LDMOS transistor employs an N-Type drain diffusion in the epitaxial layer. The on-state resistance, $R_{ON}$, of this device is dominated by the N-Type drain diffusion. In at least one example, to reduce the on-state resistance, $R_{ON}$, a field plate is included in the LDMOS device. This field plate also provides an additional benefit of drain to source breakdown voltage relief.

Hot carrier injection is a phenomenon in solid-state electronic devices where an electron or a "hole" gains sufficient kinetic energy to overcome a potential barrier necessary to break an interface state. The term "hot" refers to the effective temperature used to model carrier density, not to the overall temperature of the device. Since the charge carriers can become trapped in the gate dielectric of a MOS transistor, the switching characteristics of the transistor can be permanently changed. Hot-carrier injection is one of the mechanisms that adversely affects the reliability of semiconductors of solid-state devices.

SUMMARY

In a first example, a driver includes a signal controller that provides a gate control signal to a gate buffer coupled to a gate of a transistor and a field plate control signal to a field plate buffer coupled to a field plate of the transistor. The signal controller provides a rising edge on the field plate control signal causing the field plate buffer to provide a bias voltage on the field plate of the transistor a predetermined amount of time after providing a rising edge on the gate control signal that causes the gate buffer to provide a turn-on voltage on the gate of the transistor that causes the transistor to transition from a cutoff region to a saturation region and to a linear region.

In a second example, a driver includes a high side laterally diffused metal-oxide semiconductor (LDMOS) transistor and a low side LDMOS transistor. A source of the high side LDMOS transistor and a drain of the low side LDMOS transistor are coupled to a phase node. The driver also includes a signal controller that includes a high side level shifter that provides a high side gate control signal to a high side gate buffer and a high side field plate control signal to a high side field plate buffer. The signal controller also includes a low side level shifter that provides a low side gate control signal to a low side gate buffer and a low side field plate control signal to a low side field plate buffer. The high side gate buffer is coupled to a gate of the high side LDMOS transistor and the high side field plate buffer is coupled to a field plate of the high side LDMOS transistor. The low side gate buffer is coupled to a gate of a low side LDMOS transistor and the low side field plate buffer is coupled to a field plate of the low side LDMOS transistor.

In a third example, a method includes outputting a rising edge to a gate buffer coupled to a gate of a LDMOS transistor. The method also includes outputting a rising edge to a field plate buffer coupled to a field plate of the LDMOS transistor a predetermined amount of time after the rising edge is output to the gate buffer.

DETAILED DESCRIPTION

Monolithic laterally diffused metal oxide semiconductor (LDMOS) transistors reduce switching power losses, thus improving efficiency of switch mode power converters, including DC-to-DC converters. One architecture of LDMOS transistors employs a field plate over a drain drift region in order to achieve a reduced gate active area, and thus gate capacitance, without compromising specific resistance, $R_{SP}$ or drain/source breakdown of the transistor. The drain drift region may be formed with Shallow Trench Isolation (STI) or LOCal Oxidation of Silicon (LOCOS) techniques.

The field plate of an LDMOS transistor enhances the accumulation region under a (positive) bias voltage thus further reducing the on-state resistance, $R_{ON}$ of the LDMOS transistor. However, the bias voltage on the field plate leads to increased channel hot carrier (CHC) degradation due to hot carrier injection (HCI) if the field plate voltage remains positive during transition events when the transistor is switched under gate, drain and current bias. CHC degradation increases the on-state resistance, $R_{ON}$ of the LDMOS transistor over operation lifetime.

A driver, such as a dynamic field plate driver is provided to address increased HCI induced from a steady bias voltage on the field plate. The driver scheme is designed to capitalize on the benefits of positive field plate bias (on-state resistance, $R_{ON}$ reduction), when the LDMOS transistor is in the linear region, while masking out the undesirable consequence of increased HCl during switching transitions, particularly transitions to and from a cutoff region of the LDMOS transistor. In particular, the driver is configured to apply a bias voltage on the field plate after the LDMOS transistor transitions from the cutoff region to the linear region, and reduce (disable/drop) the bias voltage on the field plate prior to the LDMOS transistor transitioning from the linear region back to the cutoff region.

Figure 1:
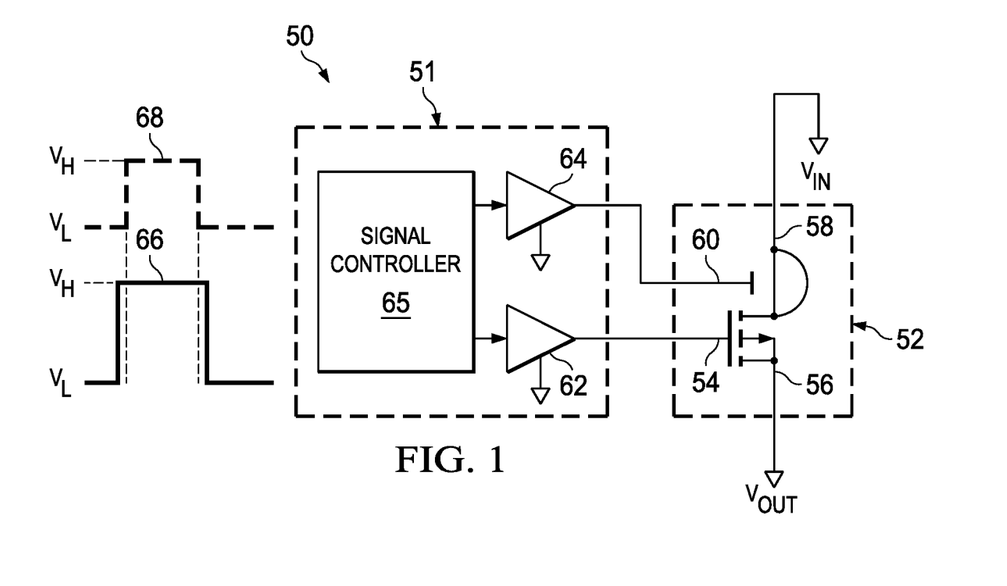
FIG. 1 is a circuit diagram of a driver for a transistor.

FIG. 1 illustrates a circuit diagram 50 of a driver 51 for a transistor 52. In at least one example, the driver 51 is implemented in a power converter, such as a DC-to-DC converter, including a Buck converter (step-down converter) or a boost converter (step-up converter). The transistor 52 includes a gate 54, a source (and bulk/body) 56, a drain 58, and a field plate 60. In at least one example, the transistor 52 is implemented as a lateral diffusion metal oxide semiconductor (LDMOS), such as an N-channel enhancement LDMOS transistor. As explained herein, the transistor 52 may be formed with STI or LOCOS techniques. In at least one example, the driver 51 and the transistor 52 are implemented on an integrated circuit (IC) chip. In at least one other example, the driver 51 and the transistor 52 are implemented as discrete circuit components.

The driver 51 includes a gate buffer 62 with an output coupled to the gate 54 of the transistor 52. The driver 51 also includes a field plate buffer 64 with an output coupled to the field plate 60 of the transistor 52. The drain 58 of the transistor 52 is coupled, for example, to an input voltage signal, $V_{IN}$, such as a 5-10 V (DC) voltage signal. The source 56 of the transistor 52 provides an output voltage, $V_{OUT}$. In some examples, as described herein, the output voltage, $V_{OUT}$ is a provided to a phase node coupled between two drivers, such as in switching converter.

In at least one example, a signal controller 65 provides input signals to the gate buffer 62 and the field plate buffer 64 that drives corresponding output signals. In at least one example, the signal controller 65 is a level shifter. In another example, the signal controller 65 is a signal generator. In at least one example, the signal controller 65 is implemented with a digital logic gate driver. In at least one other example, the signal controller 65 is implemented in a complex amplifier buffer.

The output of the gate buffer 62 is driven by a gate control signal 66 provided by the signal controller 65 and the output of the field plate buffer 64 is driven by a field plate control signal 68 provided by the signal controller 65. The gate control signal 66 is a pulsed wave signal (rectangular wave) that oscillates between a low voltage level $V_L$, (e.g., about 0 V) and a high voltage level, $V_H$ (e.g., about 5 V).

The transistor 52 operates in a manner similar to an n-channel metal oxide semiconductor field-effect transistor (NMOS). Accordingly, the transistor switches from a cutoff region (sometimes referred to as "off mode") to a saturation region (sometimes referred to as a "current source on mode") and to a linear region (sometimes referred to a resistive region) based on a gate-to-source voltage, $V_{GS}$ and drain-to-source voltage, Vds, of the transistor 52. The transistor 52 operates in the cutoff region if the gate-to-source voltage $V_{GS}$ is a turn-off voltage that is less than a threshold voltage (e.g., about 1.2 V in at least one example). Additionally, in this example, the transistor 52 transitions from the cutoff region to the saturation region if the gate-to-source voltage $V_{GS}$ rises to the threshold voltage, also referred to as the turn-on voltage, and then continues to the linear region when $V_{GS}$ rises above the turn-on voltage towards the full enhancement voltage, such as about 5 V. Additionally, applying a positive voltage (about equal to the threshold voltage) to the field plate 60 reduces an overall specific resistance, $R_{SP}$ of the transistor 52, which in turn reduces an on resistance, $R_{ON}$ of the transistor 52.

However, if the positive voltage is applied to the field plate 60 before the transistor 52 is operating in the linear region (e.g., when the transistor 52 is transitioning from the cutoff region to the linear region), the transistor 52 experiences hot carrier injection that causes CHC degradation over time. Thus, the higher percentage of the time that the transistor 52 transitions from the cutoff region to the linear region and the positive voltage is applied to the field plate 60 of the transistor 52, the more CHC degradation is experienced by the transistor 52, and this reduces the overall lifetime of the transistor 52.

To reduce the CHC degradation of the transistor 52, the driver 51 is designed to apply the positive voltage (e.g., about equal to the threshold voltage) after the transistor is transitioned from the cutoff region to the linear region. Additionally, the driver 51 is designed to reduce the voltage to the field plate 60 to about 0 V prior to the transistor 52 transitioning from the linear region to the saturation region and/or toward the cutoff region.

In particular, the gate buffer 62 receives a gate control signal 66 and outputs a similarly shaped (and possibly scaled) version of the gate control signal 66 to the gate 54 of the transistor 52. Additionally, the field plate buffer 64 receives a field plate control signal 68 and outputs a similarly shaped (and possibly scaled) version of the field plate control signal 68 to the field plate 60.

As illustrated, the gate control signal 66 is a pulse signal that rises from the low voltage level, $V_L$ (e.g., about 0 V) to the high voltage level, $V_H$ (e.g., about 5 V). Upon the gate control signal 66 rising to the high voltage level, $V_H$ the gate buffer 62 applies a high voltage (e.g., about 5 V) to the gate 54. Such a high voltage generates a gate to source voltage, $V_{GS}$ that reaches the threshold voltage for the transistor 52, thereby causing the transistor 52 to transition from the cutoff region to the saturation region and toward the linear region. Similarly, upon the gate control signal 66 falling from the high voltage level, $V_H$ to the low voltage level $V_L$, the gate buffer 62 applies a low voltage signal (e.g., about 0 V) to the gate 54 that causes the transistor 52 to transition from the linear region toward the cutoff region.

Additionally, in at least one example, the field-plate control signal 68 is also a pulsed signal. In particular, the field plate control signal 68 is a pulse signal that rises from the low voltage level, $V_L$ (e.g., about 0 V) to about the high voltage level, $V_H$ (e.g., about 4.5-5 V). As illustrated, the field plate control signal 68 has a shorter pulse width than the gate control signal 66. More specifically, the field plate control signal 68 rises from the low voltage level, $V_L$ to the high voltage level, $V_H$ a predetermined amount of time (e.g., delay) after the gate control signal rises to the high level. This high voltage level, $V_H$ causes the field plate buffer 64 to apply the positive bias plate voltage to the field plate 60 of the transistor, thereby lowering the specific resistance, $R_{SP}$ and the on resistance, $R_{ON}$ of the transistor 52. Similarly, the field plate control signal 68 falls from the high voltage level, $V_H$ to the low voltage level, $V_L$ prior to the gate control signal falling from the high voltage level, $V_H$ to the low voltage level, $V_L$.

By controlling the gate control signal 66 and the field plate control signal 68 from the signal controller 65 in this manner, the driver 51 applies the positive plate voltage to the field plate 60 at times when the transistor 52 is operating in the linear region. Accordingly, the driver 51 lowers the specific resistance, $R_{SP}$ and the on resistance, $R_{ON}$ of the transistor 52. Additionally, the driver 51 applies the low voltage level (about 0 V) when the transistor 52 is transitioning from the linear region to the cutoff region. Accordingly, the driver 51 reduces the effect of CHC degradation to the transistor 52, thereby increasing the lifetime of the transistor 52.

Figure 2:
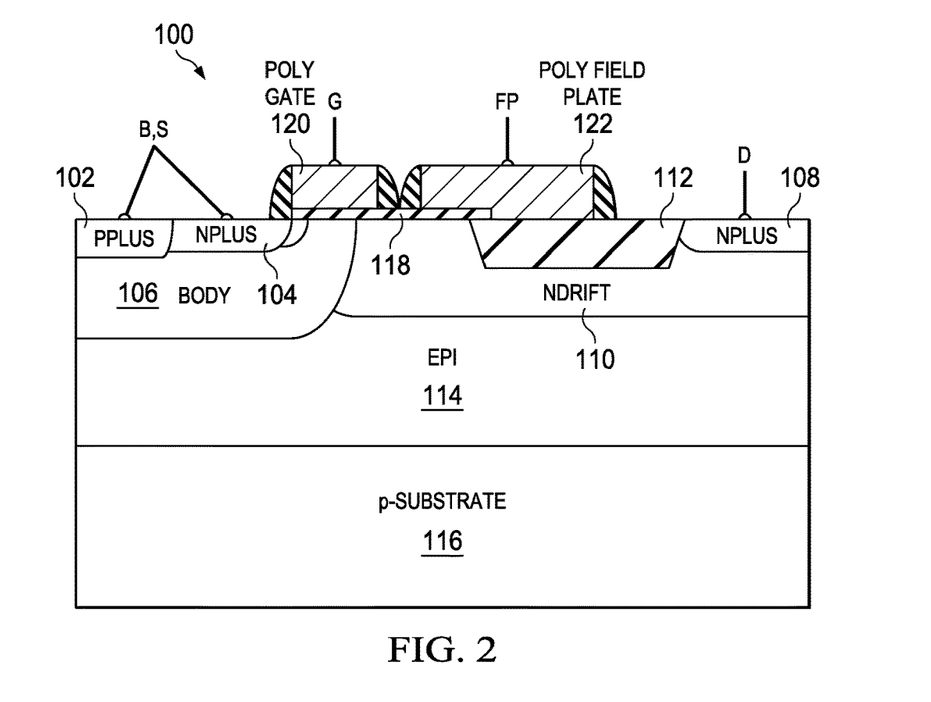
FIG. 2 is a diagram of a laterally diffused metal oxide semiconductor (LDMOS) transistor formed with Shallow Trench Isolation (STI) techniques.

FIG. 2 illustrates an example of a transistor 100 that is employable as the transistor 52 of FIG. 1. In some examples, the transistor 100 is an LDMOS transistor formed with STI techniques. The transistor 100 includes a source region 104 and an a bulk region 102 that provide source and bulk (body) connection, labeled in FIG. 2 as 'S' and 'B' respectively. In the example illustrated, the body region 102 is formed with P+ material (heavily doped P type material) and the source region 104 is formed with N+ material (heavily doped N type material). The transistor 100 also includes a body 106 that underlies the P+ region 102 and the source region 104. In at least one example, the body region 106 is formed of P type material. The transistor 100 further includes a drain region 108 formed of an N-Type material, for example, NDRIFT. The drain region 108 provides a drain terminal, labeled in FIG. 2 as 'D'.

The drain region 108 contacts an N drift region (labeled in FIG. 2 as "NDRIFT") formed of a lightly doped N type material. A thick oxide layer 112 overlays a portion of the N drift region 110. The transistor 100 still further includes an epitaxial layer 114 that overlays a P-type substrate 116. The thick oxide layer 112 is formed with STI techniques.

The transistor includes a thin layer of oxide 118 that operates as an insulator for a gate region 120 formed of polysilicon (POLY) material (and labeled in FIG. 2 as "POLY GATE"). The gate region 120 provides a gate terminal for the transistor 100 (labeled in FIG. 2 as 'G'). Additionally, a field plate region 122 formed of POLY material (and labeled in FIG. 2 as "POLY FIELD PLATE") overlays a portion of the thin oxide 118 and a portion of the thick oxide 112. The field plate region 122 provides a field plate terminal (labeled in FIG. 2 as "FP"), such that the transistor 100 has a split polysilicon structure, which may alternatively be referred to as a "split poly" structure.

Upon application of a voltage between the gate terminal G and the source terminal S, ($V_{GS}$) a channel is formed between the source region 104 and the drain region 108 allowing current to between the drain D and the source S, thereby transitioning the transistor 100 from a cutoff region, to the saturation region and to the linear region. Additionally, as noted with respect to FIG. 1, application of a positive plate voltage to the field plate terminal FP enhances electron accumulation in the NDRIFT region 110, thereby lowering the resistance of the NDRIFT region 110 such that a specific resistance, $R_{SP}$ of the transistor 100 is reduced. Additionally, an on resistance, $R_{ON}$, which corresponds to a resistance between the source region 104 and the drain region 108 of the transistor 100, varies as a function of the specific resistance, $R_{SP}$. Equation 1 defines a relationship between the on-state resistance, $R_{ON}$ and the specific resistance $R_{SP}$ of the transistor.

$$\frac{R_{SP}}{A} = R_{ON} \quad \text{Equation 1}$$

Wherein:
$R_{SP}$ is the specific resistance of the transistor;
$R_{ON}$ is the drain-to-source resistance (or on-state resistance) of the transistor operating in the saturation region;
A is the area of the transistor.

Accordingly, as demonstrated in Equation 1, lowering the specific resistance, $R_{SP}$ of the transistor 100 also lowers the on-state resistance of the transistor 100, $R_{ON}$. In situations where the positive plate voltage is applied to the field plate 122 during transitions between the cutoff region and the linear region, CHC degradation rates are increased. However, as noted with respect to FIG. 1, a driver (e.g., the driver 51 of FIG. 1) selectively asserts (applies) the positive plate voltage at times when the transistor 100 has transitioned to the linear region. Moreover, the driver selectively de-asserts (drops) the positive plate voltage to a low voltage level (e.g., about 0) prior to the transistor 100 switching from the linear region to the cutoff region. In this manner, CHC degradation of the transistor 100 is reduced, thereby increasing the lifetime of the transistor 100.

Figure 3:
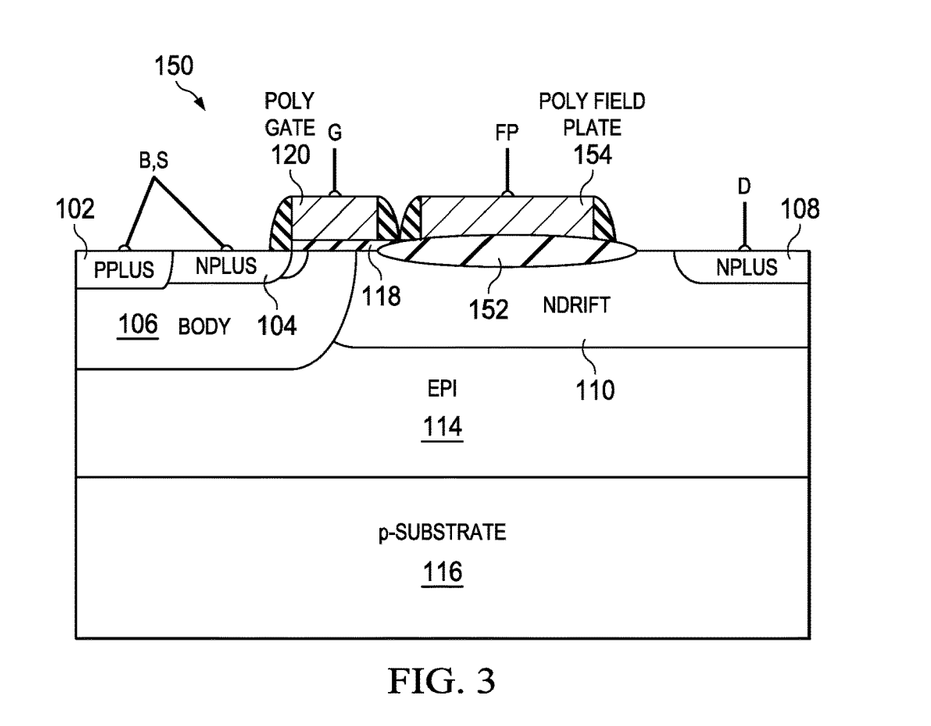
FIG. 3 is a diagram of an LDMOS transistor formed with LOCal Oxidation of Silicon (LOCOS) techniques.

FIG. 3 illustrates another example of a transistor 150 that is employable as the transistor 52 of FIG. 1. The transistor 150 is another example of an N-channel LDMOS transistor, wherein the transistor 150 is formed (at least in part) with LOCOS techniques. For purposes of simplification of explanation, the same reference numbers are employed in FIGS. 2 and 3 to denote the same structure.

In contrast to the transistor 100 of FIG. 2, the transistor 150 of FIG. 3 includes a thick oxide 152 (and the N drift region 110), and a field plate 154 formed over the thick oxide 152 that are each formed with LOCOS techniques. The operation of the transistor 150 is similar to the operation of the transistor 100 of FIG. 2. Additionally, in the transistor 150, CHC degradation with an electrically neutral voltage (e.g., about 0 V) applied to the field plate 154 is lower (slower) than the transistor 100 of FIG. 2 with a similar electrically neutral voltage applied to the field plate 122. Conversely, the CHC degradation incurred with a positive voltage (e.g., about 5 V) applied to the field plate 154 in the saturation region is higher (faster) than the transistor 100 of FIG. 2 with a similar positive bias voltage applied to the field plate 122 in saturation region. Moreover, application of the positive bias voltage to the field plate 154 of the transistor 150 (of FIG. 3) reduces a drift resistance in the NDRIFT region 110 more than in a similar application of the positive voltage to the field plate 122 of the transistor 100 of FIG. 2.

Figure 4:
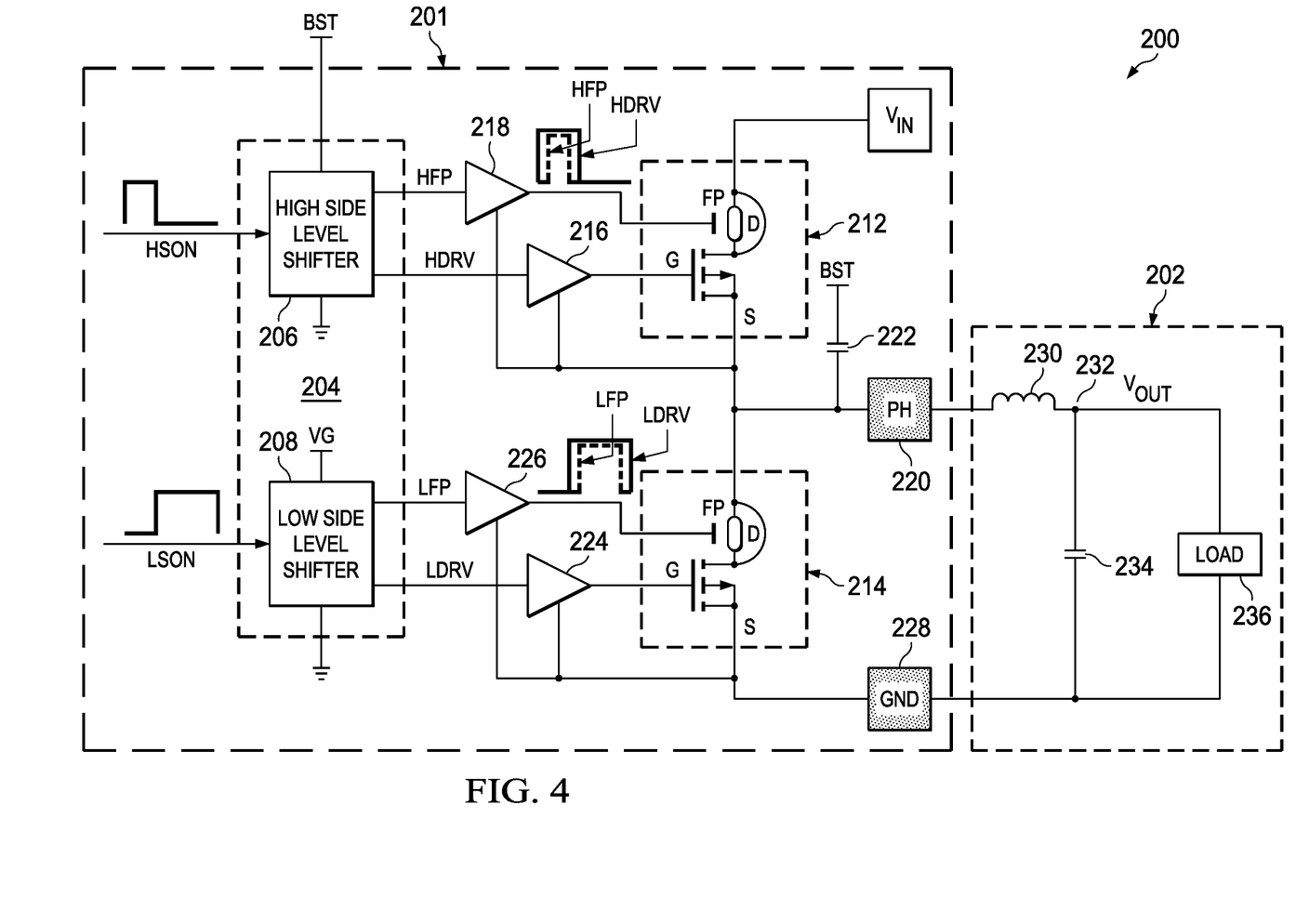
FIG. 4 is a circuit diagram of a driver for a switching power converter.

FIG. 4 illustrates an example diagram of a switching power converter 200 (a circuit). The switching power converter 200 can include a driver 201 and a filter 202. In the example illustrated, the switching power converter 200 is a buck (step-down) converter. However, in another example, the switching power converter 200 is a boost converter (step-up converter).

In at least one example, the driver 201 includes a signal controller 204. The signal controller 204 may be employed to implement the signal controller 65 of FIG. 1. Thus, in at least one example, the signal controller 204 is implemented with digital logic gate driver. In at least one other example, the signal controller 204 is implemented with a microcontroller (e.g., in a complex buffer). The signal controller 204 includes a pair of level shifters, namely a high side level shifter 206 and a low side level shifter 208. Moreover, although the driver 201 illustrates the high side level shifter 206 and the low side level shifter 208 as being logically discrete components, in some examples, the constituent components of the signal controller 204 are integrated.

The driver 201 includes a high side transistor 212 and a low side transistor 214. In at least one example, the high side transistor 212 and the low side transistor 214 are the same type of transistor. In particular, each of the high side transistor 212 and the low side transistor 214 are N-channel LDMOS transistors that include a field plate, such as the transistor 100 illustrated in FIG. 2 or the transistor 150 illustrated in FIG. 3. Thus, the high side transistor 212 and the low side transistor 214 each include connections (terminals) for a gate, a source, a drain, a bulk and a field plate.

The high side level shifter 206 receives a high side control signal, which is referred to as a high side on (HSON) signal and the low side level shifter 208 receives a low side control signal, which is referred to as a low side on (LSON) signal. In at least one example, the HSON and LSON signals swing from a low voltage level (e.g., about 0 V) to a high voltage level (e.g., about 5 V). The HSON signal and the LSON signals are complements of each other. Thus, the HSON signal is at the low voltage level when the LSON signal is at the high voltage level, and vice versa.

The high side level shifter 206 receives a boost voltage level (labeled in FIG. 4 as "BST") and is also coupled to ground (or another electrically neutral node). The boost voltage sets a high voltage level for an output of the high side level shifter 206. In at least one example, the boost voltage level, BST is set by a capacitor and a voltage source. The high side level shifter 206 provides high side gate control signal referred to as a high driver, HDRV at a low voltage level (e.g., about 0 V) in when the HSON signal is low. Additionally, the high side level shifter 206 provides a rising edge on the high driver, HDRV (a pulsed signal) to the boost voltage, BST in response to a rising edge on the HSON signal.

Additionally, the high side level shifter 206 outputs a high field plate control signal, referred to as a high field plate signal, HFP. In at least one example, the high driver, HDRV, is a pulsed signal. In this example, the high field plate signal, HFP is a puled signal that has a shorter pulse width than the high driver, HDRV. In particular, as illustrated, the high field plate signal, HFP has a rising edge that is initiated a predetermined amount of time after a rising edge of the high driver, HDRV. Additionally, the high field plate signal, HFP has a falling edge that is initiated a predetermined amount of time prior to a falling edge of the high driver, HDRV.

In at least one example, the predetermined amount of time that the high side level shifter 206 delays after the rising edge of the high driver, HDRV before initiating the rising edge of the high field plate signal, HFP varies as a function of a switching time of the high side transistor 212. In particular, the faster the switching time of the high side transistor 212, the less time delay is needed to provide the rising edge for the high field plate signal, HFP. In some examples, the predetermined amount of time may be about 1 to about 10 nanoseconds (ns).

The low side level shifter 208 receives a gate voltage level (labeled in FIG. 4 as "VG") and the low side level shifter 208 is coupled to ground (or another electrically neutral node). In at least one example, the gate voltage level, VG is about 5 V. The gate voltage sets a high voltage level for an output of the low side level shifter 208. The low side level shifter 208 provides a low gate control signal, referred to as a low driver, LDRV that is at a low voltage level (e.g., about 0 V) when the LSON signal is low. Additionally, the low side level shifter 208 provides a rising edge (rising to the gate voltage, VG) on the low driver, LDRV in response to the LSON signal being high. Additionally, the low side level shifter 208 outputs a low field plate control signal, referred to as a low field plate signal, LFP.

In at least one example, the low driver, LDRV is a pulsed signal. In this example, the low field plate signal, LFP is also a pulsed signal that has a shorter pulse width than the low driver, LDRV. In particular, as illustrated, the low field plate signal, LFP has a rising edge that is initiated a predetermined amount of time after a rising edge of the low driver, LDRV. Additionally, the low field plate signal, LFP has a falling edge that is initiated a predetermined amount of time prior to a falling edge of the low driver, LDRV.

In at least one example, the predetermined amount of time that the low side level shifter 208 waits after the rising edge of the low driver, LDRV before initiating the rising edge of the low field plate signal, LFP varies as a function of a switching time of the low side transistor 214. In particular, the faster the switching time of the low side transistor 214, the less time delay is needed to provide the rising edge for the low field plate signal, LFP. In some examples, the predetermined amount of time may be about 1 ns to about 10 ns.

The high driver, HDRV is provided to an input of a high side gate buffer 216 of the driver 201. An output of the high side gate buffer 216 coupled to the gate of the high side transistor 212. The high field plate signal, HFP is provided to an input of a high side field plate buffer 218. An output of the high side field plate buffer 218 is coupled to the field plate of the high side transistor 212. The drain of the high side transistor 212 is coupled to an input voltage, $V_{IN}$ of the driver 201. The input voltage, $V_{IN}$ is a DC signal that may be nearly any voltage for which the high side transistor 212 and the low side transistor 214 are rated. In at least one example, the input voltage, $V_{IN}$ is about 10-20 V. A negative terminal of the high side field plate buffer 218 and the high side gate buffer 216 are coupled to the source of the high side transistor 212. Moreover, the bulk of the high side transistor 212 is coupled to the source of the high side transistor 212. The source of the high side transistor 212 is also coupled to a phase node 220 (labeled in FIG. 4 as "PH") of the driver 201. In at least one example, the phase node 220 is also coupled to the boost voltage, BST via a capacitor 222.

The phase node 220 is also coupled to the drain of the low side transistor 214. The low driver, LDRV is provided to an input of a low side gate buffer 224 of the driver 201. An output of the low side gate buffer 224 coupled to a gate of the low side transistor 214. The low field plate signal, LFP is provided to an input of a low side field plate buffer 226. An output of the low side field plate buffer 226 is coupled to the field plate of the low side transistor 214. The source of the low side transistor 214 is coupled to a ground node 228 (e.g., about 0 V or another electrically neutral node).

A negative terminal of the low side field plate buffer 226 and the low side gate buffer 224 are coupled to the source of the low side transistor 214 and to the ground node 228. Moreover, the bulk of the low side transistor 214 is coupled to the source of the low side transistor 214.

The filter 202 includes an inductor 230 coupled to the phase node 220. The inductor 230 is also coupled to an output node 232. A voltage at the output node, $V_{OUT}$ is provided to a capacitor 234 and a load 236. The capacitor 234 and the load 236 are each coupled to the ground node 228, such that the capacitor 234 and the load 236 are connected in parallel.

In operation, a rising edge (high pulse) in the HSON signal (wherein the LSON signal is low) causes the high side level shifter 206 to generate a rising edge for the high side driver, HDRV that is provided to the high side gate buffer 216. In response, the high side gate buffer 216 passes a high voltage (e.g., about 5 V) to the gate of the high side transistor 212. The positive voltage at the gate of the high side transistor 212 transitions the high side transistor 212 from the cutoff region to the saturation region and toward the linear region. A predetermined amount of time after the rising edge of the high side driver HDRV (e.g., about 1 to about 10 ns), the high side level shifter 206 provides a rising edge on the high field plate signal HFP to the high side field plate buffer 218. In response, the high side field plate buffer 218 provides a positive field plate voltage to the field plate of the high side transistor 212. The positive field plate voltage reduces a specific resistance, $R_{SP}$ of the high side transistor 212, which also reduces a drain-to-source resistance, $R_{DS}$ of the high side transistor 212. Accordingly, the drain-to-source voltage, $V_{DS}$ of the high side transistor 212 reduces to about $V_{IN}$ minus a voltage drop equal to the $R_{ON}$ times a drain to source current ($I_{DS}$) of the high side transistor 212.

Concurrently during a high pulse of HSON, the LSON signal (which are complimentary signals) is low. A low LSON signal causes the low side level shifter 208 to output a low signal for both the low driver, LDRV and the low field plate signal, LFP. Accordingly, both the low side gate buffer 224 and the low field plate buffer output a low signal (e.g., about 0 V) and the low side transistor 214 remains in the cutoff region.

Accordingly, during a high pulse of the HSON signal, the voltage at the phase node 220 is about equal to the input voltage $V_{IN}$ minus a voltage drop across the high side transistor 212 that is operating in the linear region. Thus, current flows to the filter 202 via the inductor 230 and into the load 236. As noted, the switching power converter 200 illustrated is a buck (step-down) converter.

It is noted that in FIG. 3, for purposes of readability the high field plate signal, HFP and the low field plate signal, LFP are illustrated as having slightly lower maximum amplitudes then the maximum amplitude of the high driver, HDRV and the low driver LDRV, respectively. However, it is to be understood that the maximum amplitude of the high field plate signal, HFP and the low field plate signal, LFP are at least about equal to the maximum amplitude of the respective high driver, HDRV and the low driver LDRV. Additionally, in some examples, the maximum amplitude of the high field plate signal, HFP and the low field plate signal, LFP may be higher than the maximum amplitude of the high driver, HDRV and the low driver LDRV, respectively, to further reduce the specific resistance, $R_{SP}$ of the high side transistor 212 and the low side transistor 214.

In some examples, upon detecting a falling edge on the HSON signal, the high side level shifter 206 outputs a falling edge of the high field plate signal, HFP. Additionally, in such examples, the high side level shifter 206 delays a predetermined amount of time after the falling edge of the high field plate signal, HFP to initiate a falling edge of the high side driver, HDRV. The predetermined amount of time can be about the same or a different amount of time that the delay between the rising edge of the high driver side driver, HDRV and the rising edge of the high field plate signal, HFP. In other examples, the high side level shifter 206 is preprogrammed/configured to initiate a falling edge of the high field plate signal, HFP based on a frequency of the HSON signal. In either situation, as illustrated, the high field plate signal, HFP has a shorter pulse width than the high side driver, HDRV. Moreover, in either such situation, a falling edge of the high field plate signal, HFP causes the high side field plate buffer 218 to drop the voltage of the field plate of the high side transistor 212 to about 0 V.

Additionally, the subsequent falling edge of the high side driver, HDRV, causes the high side gate buffer 216 to reduce the voltage to the gate of the high side transistor 212 to about 0 V, thereby causing the high side transistor 212 to transition from the linear region to the cutoff region. Since (at this time) the field plate voltage applied by the high side field plate buffer 218 has been reduced to about 0 V, CHC degradation in the high side transistor 212 due to the transition to the cutoff region is reduced.

About the same time that the falling edge of HSON is received at the high side level shifter 206, a rising edge on the LSON signal is detected at the low side level shifter 208 indicating a high pulse of LSON. The rising edge on the LSON signal causes the low side level shifter 208 to generate a rising edge for the low side driver, LDRV, which is passed by the low side gate buffer 224 to the gate of the low side transistor 214. The positive voltage at the gate of the low side transistor 214 transitions the low side transistor 214 from the cutoff region to the linear region. After a predetermined amount of time after the rising edge of the low side driver LDRV, the low side level shifter 208 provides a rising edge of the low side field plate signal, LFP, which is passed by the low side field plate buffer 226 as a positive field plate voltage on the low side transistor 214. The positive field plate voltage reduces a specific resistance, $R_{SP}$ of the low side transistor 214, which also reduces a drain-to-source resistance, $R_{DS}$ of the low side transistor 214. Accordingly, the drain-to-source voltage, $V_{DS}$ of the low side transistor 214 reduces to about 0 V plus a voltage equal to the $R_{ON}$ times a drain to source current, $I_{DS}$ of the low side transistor 214.

Accordingly, in a state where HSON is low and LSON is high the voltage at the phase node 220 drops to about 0 plus the voltage drop across the low side transistor 214. Additionally, upon detecting a falling edge on the LSON signal, the low side level shifter 208 initiates a falling edge on the low field plate signal, LFP. In such examples, the low side level shifter 208 delays a predetermined amount of time after the falling edge of the low field plate signal, LFP to initiate a falling edge of the low side driver, LDRV. The predetermined amount of time can be about the same or a different amount of time than the delay between the rising edge of the low side driver, LDRV and the rising edge of the low field plate signal, LFP. In other examples, the low side level shifter 208 is be preprogrammed/configured to initiate a falling edge of the low field plate signal, LFP based on a frequency of the LSON signal. In either situation, as illustrated, the low field plate signal, LFP has a shorter pulse width than the low driver LDRV. Moreover, in either such situation, a falling edge of the low field plate signal, LFP causes the low side field plate buffer 226 to reduce (drop) the voltage of the field plate of the low side transistor 214 to about 0 V.

Additionally, the subsequent falling edge of the low side driver signal, LDRV, causes the low side gate buffer 224 to reduce the voltage to the gate of the low side transistor 214 to about 0, thereby causing the low side transistor 214 to transition from the linear region to the cutoff region. Since (at this time) the field plate voltage applied by the low side field plate buffer 226 has been reduced to about 0 V, CHC degradation due to the transition at the low side transistor 214 is reduced. Therefore, employment of the driver 201 increases an operational lifetime of the high side transistor 212 and the low side transistor 214.

Figure 5:
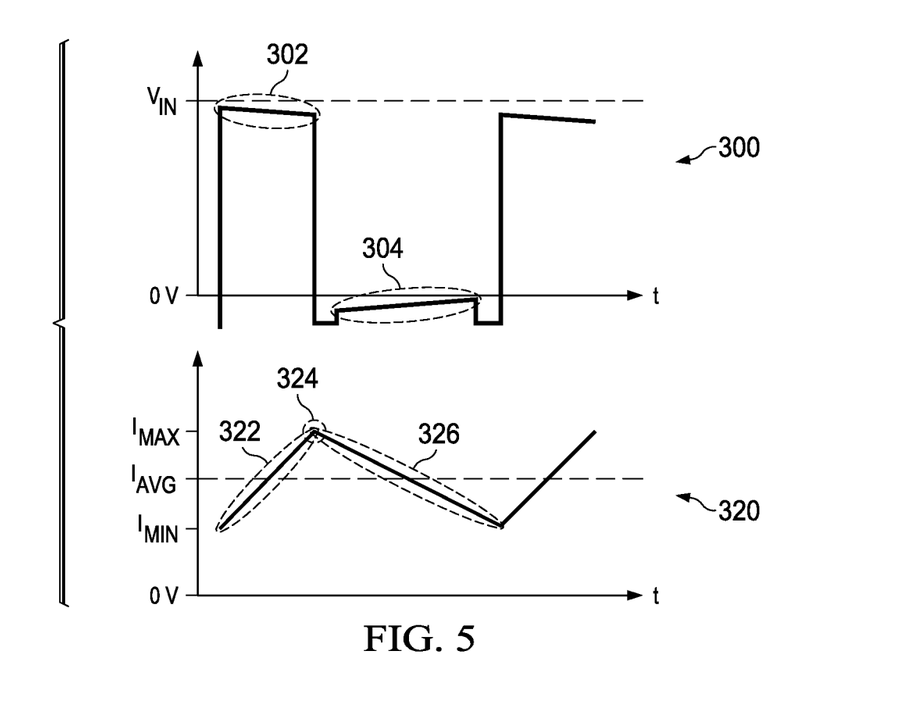
FIG. 5 illustrates graphs that plotting a voltage and current characteristics of the driver and switching power converter of FIG. 4.

FIG. 5 illustrates an example of a graph 300 that plots a voltage of the phase node 220 as a function of time and graph 320 that plots a current from of the phase node 220 and through the inductor 230 as the same function of time. As denoted by the reference 302 in the graph 300, a rising edge on the HSON signal induces a voltage of about the input voltage, $V_{IN}$ at the phase node 220. During this time, as indicated by the reference 322 in the graph 300, the current output to the inductor 230 rises from about a minimum current, $I_{MIN}$ to about a maximum current, $I_{MAX}$.

Additionally, as illustrated in the graph 300, upon a falling edge of the HSON signal, LSON rises, and the voltage at phase node 220 is about 0, as indicated by the reference 304. Moreover, the falling edge of the HSON signal results in a negative inflection point 324 of the current output to the inductor 230. Additionally, during an LSON high pulse, the current output to the inductor 230 reduces from about the maximum current $I_{MAX}$, to about the minimum current, $I_{MIN}$ as indicated by the reference 326. Moreover, as illustrated by the graphs 300 and 320, this cycle repeats for the voltage and current of the phase node 220.

Figure 6:
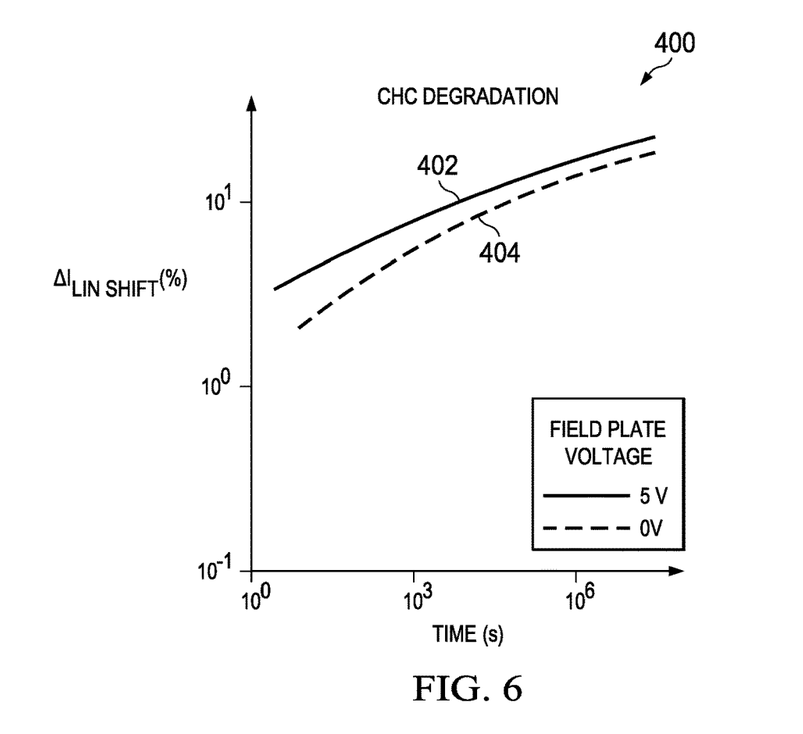
FIG. 6 illustrates a plot of a channel hot carrier (CHC) shift as a function of time for an N-channel LDMOS transistor.

FIG. 6 illustrates a graph 400 of a change in linear current shift, $\Delta I_{LIN\ SHIFT}$ (in percentage) as a function of time (in seconds (s)) for an N-channel LDMOS transistor, such as the transistor 100 at a gate-source voltages ($V_{GS}$) that could be, for example, about 1.5 V to 3 V. The graph 400 include a plot 402 that corresponds to a field plate voltage of about 5 V and a plot (a dashed line) 404 corresponding to a field plate voltage of about 0 V. The change in the linear current shift, $\Delta I_{LIN\ SHIFT}$ occurs, at least in part, due to CHC degradation. Moreover, a shift in linear current, $\Delta I_{LIN}$ is indicative of a proportional shift of an on-resistance, $R_{ON}$ for the transistor. That is, an increase (a shift) in the linear current, $\Delta I_{LIN}$ is indicative of an increase in the on-resistance, $R_{ON}$ for the transistor. Similarly, a decrease in the linear current, $\Delta I_{LIN}$ is indicative of a decrease in the on-resistance, $R_{ON}$ for the transistor.

As illustrated by the graph 400, changing the field plate voltage from about 0 V to about 5 V results in different linear current shifts, $\Delta I_{LIN\ SHIFT}$. Thus, by controlling a timing of the field plate voltage relative to the gate to source voltage ($V_{GS}$), CHC degradation that induces such linear current shifts, $\Delta I_{LIN\ SHIFT}$ is reduced while still benefiting from an on-resistance, $R_{ON}$ reduction. For instance, applying a positive voltage on the field plate after the transistor goes into the linear region, the CHC degradation would emulate that of a 0 V field plate because the positive voltage is applied after the transistor transitions from the saturation region. The reduction of the on-resistance, $R_{ON}$ in the linear region results from applying a positive voltage on the field plate during operation in the linear region.

Figure 7:
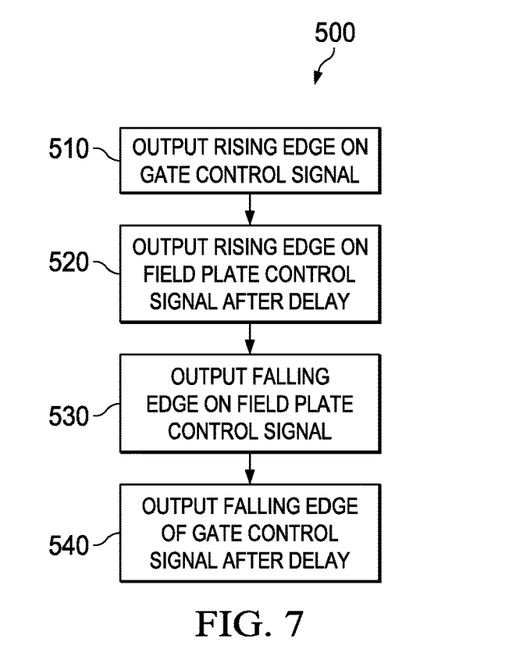
FIG. 7 is a flow diagram of a method for driving an LDMOS transistor.

In view of the foregoing structural and functional features described above, an example method will be better appreciated with reference to FIG. 7. While, for purposes of simplicity of explanation, the example method of FIG. 7 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method.

FIG. 7 illustrates a flowchart of an example method 500 for operating an LDMOS transistor, such as the N-channel LDMOS transistor 100 of FIG. 2 and/or the LDMOS transistor 150 of FIG. 3. The method 500 may be executed by a signal controller, such as the signal controller 65 of FIG. 1 and/or the signal controller 204 of FIG. 4. At 510, the signal controller outputs a rising edge on a gate control signal to a gate buffer (e.g., the gate buffer 62 of FIG. 1) to induce a positive gate voltage (e.g., of about 5 V) on the LDMOS transistor. Thus, the transistor transitions from the cutoff region to the saturation region and toward the linear region. At 520, after a delay of a predetermined amount of time (e.g., about 1-10 ns) the signal controller provides a rising edge on a field plate control signal to a field plate buffer (e.g., the field plate buffer 64 to induce a positive bias voltage (e.g., about 5 V) on the field plate of the transistor. The application of the positive bias voltage on the field plate of the transistor reduces the specific resistance, $R_{SP}$ of the transistor.

At 530, the signal controller outputs a falling edge on the field plate control signal to the field plate buffer causing the field plate buffer to reduce the positive bias voltage on the field plate to about an electrically neutral level (e.g., about 0 V). At 540, after another delay, the signal controller outputs a falling edge on the gate control signal to the gate buffer causing the gate buffer to reduce the gate voltage of the LDMOS, thereby causing the transistor to transition from linear region toward the cutoff region. By operation of the method 500, situations where the transistor operates in the cutoff region and has a positive field plate voltage applied are avoided, thereby reducing an amount of CHC shift in the transistor.

In this description, the term "based on" means based at least in part on. Modifications are possible in the described embodiments, and other embodiments are possible, within the scope of the claims.

What is claimed is:

1. A driver comprising:
   a signal controller including:
      a high side level shifter having a boost voltage node configured to receive a boost voltage for providing a high side gate control signal to a high side gate buffer and a high side field plate control signal to a high side field plate buffer; and
      a low side level shifter outputting a low side gate control signal to a low side gate buffer and a low side field plate control signal to a low side field plate buffer;
   a high side laterally diffused metal-oxide semiconductor (LDMOS) transistor having an oxide layer above the substrate, a gate layer on top of and overlapping the oxide layer, and a field plate partially overlapping the oxide layer and extending beyond the oxide layer above a drain drift region; and
   a low side LDMOS transistor, wherein a source of the high side LDMOS transistor and a drain of the low side LDMOS transistor are coupled to a phase node and to the boost voltage node of the high side level shifter,
   wherein the high side gate buffer is coupled to a gate of the high side LDMOS transistor and the high side field plate buffer is coupled to a field plate of the high side LDMOS transistor;
   wherein the low side gate buffer is coupled to a gate of the low side LDMOS transistor and the low side field plate buffer is coupled to a field plate of the low side LDMOS transistor.

2. The driver of claim 1, wherein the high side level shifter outputs a rising edge on the high side gate control signal in response to a rising edge of a high side control signal and the high side level shifter outputs a rising edge on the high side field plate control signal at a first time after the rising edge of the high side gate buffer.

3. The driver of claim 2, wherein the high side level shifter outputs a falling edge on the high side field plate control signal in response to a falling edge of the high side control signal and the high side level shifter outputs a falling edge on the high side gate control signal at a second time after the falling edge on the high side field plate control signal.

4. The driver of claim 3, wherein the low side level shifter outputs a rising edge on the low side gate control signal in response to a rising edge of a low side control signal and the low side level shifter outputs a rising edge on the low side field plate control signal at a third time after the rising edge of the low side gate buffer.

5. The driver of claim 4, wherein the low side level shifter outputs a falling edge on the low side field plate control signal in response to a falling edge of the low side control signal and the low side level shifter outputs a falling edge on the low side gate control signal at a fourth time after the falling edge on the low side field plate control signal.

6. The driver of claim 5, wherein the high side control signal and the low side control signal are complementary signals.

7. The driver of claim 1, wherein a capacitor is coupled to the phase node.

8. The driver of claim 1, wherein a drain of the high side LDMOS transistor receives an input voltage and a source of the low side LDMOS transistor is coupled to an electrically neutral node.

9. The driver of claim 8, wherein the phase node is coupled to an input node of a filter on a switching converter.

10. The driver of claim 9, wherein the switching power converter is a step-down power converter that provides an output signal with voltage level less than the voltage level of the input voltage.

11. A driver circuit comprising:
a high-side LDMOS FET having a gate, a source, a drain and a field plate, wherein the field plate is formed over and extends beyond an insulating material and is laterally disposed between the gate and the drain of the high-side LDMOS FET;
a low-side LDMOS FET having a gate, a source, a field plate and a drain coupled to the source of the high-side LDMOS FET, wherein the field plate is formed over and extends beyond an insulating material and is laterally disposed between the gate and drain of the low-side LDMOS FET;
a high-side level shifter having a first output coupled to the gate of the high-side LDMOS FET and a second output coupled to the field plate of the high-side LDMOS FET; and
a low-side level shifter having a first output coupled to the gate of the low-side LDMOS FET and a second output coupled to the field plate of the low-side LDMOS FET.

12. The driver of claim 11, wherein the high-side level shifter supplies a voltage to the field plate of the high-side LDMOS FET after the high-side LDMOS FET has turned on.

13. The driver of claim 11, wherein the low-side level shifter supplies a voltage to the field plate of the low-side LDMOS FET after the low-side LDMOS FET has turned on.

* * * * *